US008653630B2

(12) United States Patent
Liaw et al.

(10) Patent No.: US 8,653,630 B2
(45) Date of Patent: Feb. 18, 2014

(54) LAYOUT FOR MULTIPLE-FIN SRAM CELL

(71) Applicant: Taiwan Semiconductor Manufacturing Company, Ltd., Hsin-Chu (TW)

(72) Inventors: Jhon Jhy Liaw, Hsinchu County (TW); Jeng-Jung Shen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/797,190

(22) Filed: Mar. 12, 2013

(65) Prior Publication Data

US 2013/0200395 A1    Aug. 8, 2013

Related U.S. Application Data

(62) Division of application No. 12/827,690, filed on Jun. 30, 2010, now Pat. No. 8,399,931.

(51) Int. Cl.
*H01L 29/06* (2006.01)

(52) U.S. Cl.
USPC ............ 257/622; 257/296; 257/369; 438/187

(58) Field of Classification Search
USPC ......... 257/137, 204, 255, 288, 296, 369, 331, 257/499, 510, 622; 438/149, 187, 257, 593, 438/279; 365/230.5, 154, 174
See application file for complete search history.

(56) References Cited

U.S. PATENT DOCUMENTS

| 5,289,432 A | 2/1994 | Dhong et al. |
| 6,084,820 A | 7/2000 | Raszka |
| 6,091,626 A | 7/2000 | Madan |
| 6,181,634 B1 | 1/2001 | Okita |
| 6,706,571 B1 | 3/2004 | Yu et al. |
| 6,858,478 B2 | 2/2005 | Chau et al. |
| 7,002,258 B2 | 2/2006 | Mali et al. |
| 7,098,491 B2 | 8/2006 | Hsieh |
| 7,190,050 B2 | 3/2007 | King et al. |
| 7,247,887 B2 | 7/2007 | King et al. |
| 7,265,008 B2 | 9/2007 | King et al. |
| 7,286,896 B2 | 10/2007 | Liu et al. |

(Continued)

OTHER PUBLICATIONS

Koji Nii et al., "27.9—A 90nm Dual-Port SRAM with 2.04μm² 8T-Thin Cell Using Dynamically-Controlled Column Bias Scheme" ISSCC 2004 / Session 27 / SRAM / 27.9, 2004 IEEE International Solid-State Circuits Conference, 0-7803-8267-6/04, 2004 IEEE, 10 pages.

*Primary Examiner* — Dung A. Le
(74) *Attorney, Agent, or Firm* — Haynes and Boone, LLP

(57) ABSTRACT

The present disclosure provides a static random access memory (SRAM) cell. The SRAM cell includes a plurality of fin active regions formed on a semiconductor substrate, wherein the plurality of fin active regions include a pair adjacent fin active regions having a first spacing and a fin active region having a second spacing from adjacent fin active regions, the second spacing being greater than the first spacing; a plurality of fin field-effect transistors (FinFETs) formed on the plurality of fin active regions, wherein the plurality of FinFETs are configured to a first and second inverters cross-coupled for data storage and at least one port for data access; a first contact disposed between the first and second the fin active regions, electrically contacting both of the first and second the fin active regions; and a second contact disposed on and electrically contacting the third fin active region.

13 Claims, 12 Drawing Sheets

(56) References Cited

U.S. PATENT DOCUMENTS

| | | |
|---|---|---|
| 7,508,031 B2 | 3/2009 | Liu et al. |
| 7,528,465 B2 | 5/2009 | King et al. |
| 7,605,449 B2 * | 10/2009 | Liu et al. .......... 257/622 |
| 7,738,282 B2 | 6/2010 | Liaw |
| 2005/0153490 A1 | 7/2005 | Yoon et al. |
| 2005/0224890 A1 * | 10/2005 | Bernstein et al. .......... 257/371 |
| 2005/0247981 A1 | 11/2005 | Wang |
| 2005/0253287 A1 | 11/2005 | Liaw |
| 2006/0068531 A1 | 3/2006 | Breitwisch et al. |
| 2007/0025132 A1 | 2/2007 | Liaw |
| 2007/0090428 A1 | 4/2007 | Liaw |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0228372 A1 | 10/2007 | Yang et al. |
| 2008/0019171 A1 | 1/2008 | Liaw |
| 2008/0258228 A1 | 10/2008 | Chuang et al. |
| 2008/0263492 A1 | 10/2008 | Chuang et al. |
| 2008/0290470 A1 | 11/2008 | King et al. |
| 2008/0296632 A1 | 12/2008 | Moroz et al. |
| 2009/0035909 A1 | 2/2009 | Chang et al. |
| 2009/0181477 A1 | 7/2009 | King et al. |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0183961 A1 | 7/2010 | Shieh et al. |
| 2010/0203734 A1 | 8/2010 | Shieh et al. |
| 2010/0264468 A1 | 10/2010 | Xu |
| 2011/0222332 A1 | 9/2011 | Liaw et al. |
| 2011/0317477 A1 | 12/2011 | Liaw |
| 2011/0317485 A1 | 12/2011 | Liaw |
| 2012/0001197 A1 | 1/2012 | Liaw et al. |
| 2012/0001232 A1 | 1/2012 | Liaw |

* cited by examiner

LAYOUT FOR MULTIPLE-FIN SRAM CELL

PRIORITY DATA

The present application is a divisional application of U.S. patent application Ser. No. 12/827,690, filed Jun. 30, 2010, which is incorporated by reference in its entirety.

CROSS REFERENCE

The present disclosure is related to the following commonly-assigned U.S. patent applications, the entire disclosures of which are incorporated herein by reference: U.S. Ser. No. 12/721,476 filed Mar. 10, 2010 by the same inventor Jhon Jhy Liaw for "FULLY BALANCED DUAL-PORT MEMORY CELL"; and U.S. Ser. No. 12/823,860 filed Jun. 25, 2010 by the same inventor Jhon Jhy Liaw for "STRUCTURE AND METHOD FOR SRAM CELL CIRCUIT".

BACKGROUND

In deep sub-micron integrated circuit technology, an embedded static random access memory (SRAM) device has become a popular storage unit of high speed communication, image processing and system-on-chip (SOC) products. The amount of embedded SRAM in micro-processors and SOCs increases to meet the performance requirement in each new technology generation. As silicon technology continues to scale from one generation to the next, the impact of intrinsic threshold voltage (Vt) variations in minimum geometry size bulk planar transistors reduces the complimentary metal-oxide-semiconductor (CMOS) SRAM cell static noise margin (SNM). This reduction in SNM caused by increasingly smaller transistor geometries is undesirable. SNM is further reduced when Vcc is scaled to a lower voltage.

To solve SRAM issues and continue to improve cell shrink capability, the fin field effect transistor (FinFET) devices are often considered for some applications. The FinFET provides both speed and device stability. The FinFET has a channel (referred to as a fin channel) associated with a top surface and opposite sidewalls. Benefits can be provided from the additional sidewall device width (Ion performance) as well as better short channel control (sub-threshold leakage). In FinFet cell devices, the setting of single fin cell device faces cell ratio problems like beta ratio (Ipd/Ipg) or alpha ratio (Ipu/Ipg). One important parameter of cell stability is referred to as "beta ratio" and is defined as the ratio between pull-down transistor drive current and pass-gate transistor drive current. A high beta ratio greater than 1 is desired in order to improve the stability of the SRAM cell. SRAM cell voltage Vcc_min is a factor related to the write capability. The corresponding parameter is the ratio between pull-up transistor drive current and pass-gate transistor drive current, referred to as "alpha ratio." Hence, in order to increase electrical current in a given cell area, the pitch between the fins has to be minimized. Unfortunately, it is difficult to achieve further reductions in pitch in FinFET devices, due to fundamental limitations in existing lithography techniques (like tight pitch fin nodes connection and contact to contact space rule).

Therefore, there is a need of new structure and method for SRAM cells to address these concerns for high-end cell application and improved multiple fins cell size.

SUMMARY

The present disclosure provides a static random access memory (SRAM) cell. The SRAM cell includes a plurality of fin active regions formed on a semiconductor substrate, wherein the plurality of fin active regions include a pair adjacent fin active regions having a first spacing and a fin active region having a second spacing from adjacent fin active regions, the second spacing being greater than the first spacing; a plurality of fin field-effect transistors (FinFETs) formed on the plurality of fin active regions, wherein the plurality of FinFETs are configured to a first and second inverters cross-coupled for data storage and at least one port for data access; a first contact disposed between the first and second the fin active regions, electrically contacting both of the first and second the fin active regions; and a second contact disposed on and electrically contacting the third fin active region.

The present disclosure also provides one embodiment of a semiconductor structure. The semiconductor structure includes a first and second fin active regions extended from a semiconductor substrate and spaced away from each other with a first distance; a third and fourth fin active regions extended from the semiconductor substrate and spaced away from each other with a second distance greater than the first distance; a first and second epitaxy features formed on the first and second fin active regions, respectively, wherein the first and second epitaxy features are laterally merged together; a third and fourth epitaxy features formed on the third and fourth fin active regions, respectively, wherein the third and fourth epitaxy features are separated from each other; a first contact disposed on the first and second epitaxy features merged together; and a second contact disposed on the third epitaxy feature, wherein the second contact is spaced away from the fourth epitaxy feature and is not electrically connected to the fourth fin active region.

The present disclosure provides yet another embodiment of a static random access memory (SRAM) cell. The SRAM cell includes a first inverter including a first pull-up transistor (PU-1) and a first and second pull-down transistors (PD-1 and PD-2); a second inverter including a second pull-up transistor (PU-2) and a third and fourth pull-down transistors (PD-3 and PD-4), the second inverter being cross-coupled with the first inverter for data storage; a port including a first pass-gate transistor (PG-1) and a second pass-gate transistor (PG-2), the port being coupled with the first and second inverters for data access, wherein each of PD-1, PD-2, PD-3, PD-4, PG-1 and PG-2 includes a n-type fin field-effect transistor (nFinFET) and each of PU-1 and PU-2 includes a p-type fin field-effect transistor (pFinFET); a first and second fin active regions having a first and second silicon epitaxy features, respectively, wherein the first and second silicon epitaxy features are merged together, and the PD-1 and PD-2 are formed on the first and second fin active regions, respectively; and a silicide feature is formed on the first and second silicon epitaxy features merged together, electrically connecting source regions of PD-1 and PD-2 together.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
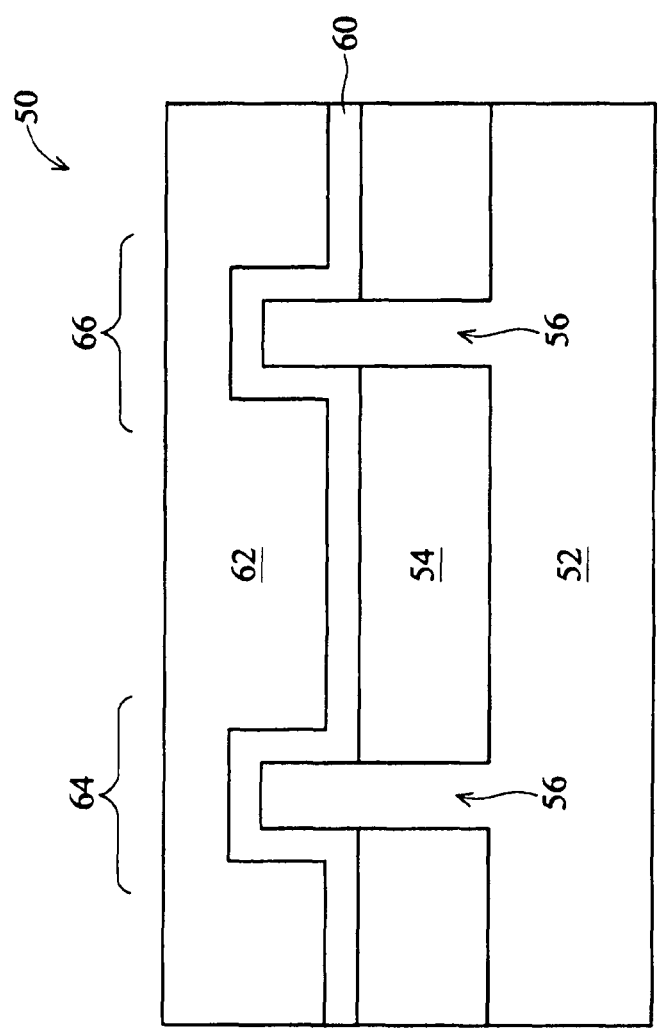
FIGS. 1 to 4 are sectional views of a portion of a SRAM device constructed according to various aspects of the present disclosure in various embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a sectional view of a semiconductor structure 50 as a portion of a SRAM cell constructed according to various aspects of the present disclosure. The semiconductor structure 50 includes a semiconductor substrate 52. The semiconductor substrate 52 includes silicon. Alternatively, the substrate includes germanium, silicon germanium or other proper semiconductor materials. The semiconductor substrate 52 includes various isolation features 54. One isolation feature is a shallow trench isolation (STI) formed in the substrate to separate various devices. The semiconductor substrate also includes various doped regions such as n-well and p-wells. The semiconductor structure 50 includes various fin active regions 56 and 58. The fin active regions 56 and 58 are oriented in parallel. The fin active regions and the STI features can be formed in a processing sequence including forming trenches in the semiconductor substrate 52 and partially filling the trenches with a dielectric material. Alternatively, the trenches are completely filled with the dielectric material. Then a polishing process, such as chemical mechanical polishing (CMP) process is applied to remove the excessive dielectric material and planarize the surface. Thereafter, the formed STI features are partially removed to form the fin active regions using a selective etch such as hydrochloride (HF) wet etch. Particularly, the processing sequence includes etching trenches in the semiconductor substrate 52 and filling the trenches by one or more dielectric materials such as silicon oxide, silicon nitride, silicon oxynitride or combinations thereof. The filled trench may have a multi-layer structure such as a thermal oxide liner layer with silicon nitride filling the trench. In furtherance of the present embodiment, the STI features are created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. The semiconductor substrate 52 also includes various n-wells and p-wells formed in various fin active regions.

Various gates are further formed on the fin active regions. A gate feature includes a gate dielectric layer 60 (such as silicon oxide) and a gate electrode 62 (such as doped polysilicon) disposed on the gate dielectric layer 60. In another embodiment, the gate feature alternatively or additionally includes other proper materials for circuit performance and manufacturing integration. For example, the gate dielectric layer includes high-k dielectric material layer. The gate electrode includes metal, such as aluminum, copper, tungsten or other proper conductive material. In yet another embodiment, the gate electrode includes a metal having proper work function to the associated FinFET. For a gate stack including high-k dielectric material and metal, the gate can be formed by a gate-last process or a high-k-last process (a complete gate-last process). In the present embodiment for illustration, the semiconductor structure 50 includes a first region 64 for one or more FinFETs and a second region 66 for one or more FinFETs.

Figure 2:
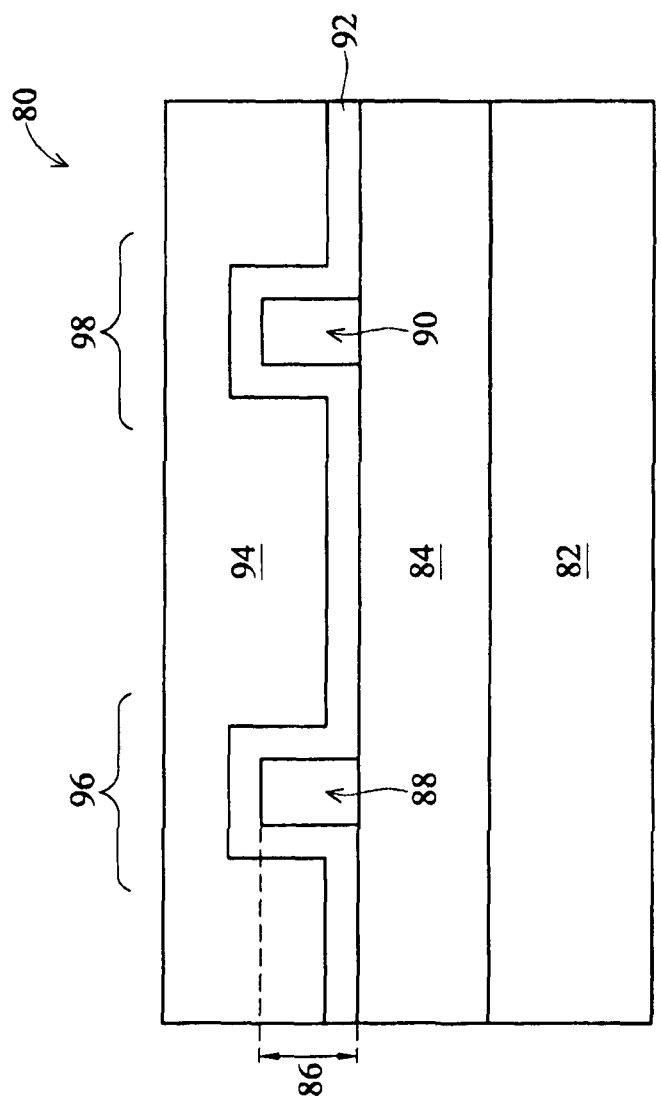

FIG. 2 is another embodiment of a sectional view of the semiconductor structure 80 as a portion of a SRAM cell. The semiconductor structure 80 includes a semiconductor substrate 82. The semiconductor substrate 82 includes silicon. Alternatively, the semiconductor substrate 82 includes germanium, silicon germanium or other proper semiconductor materials. The semiconductor structure 80 includes a dielectric layer 84 formed on the semiconductor substrate 82 for isolation. In one example, the dielectric layer 84 includes silicon oxide. The semiconductor structure 80 includes another semiconductor layer 86, such as silicon, formed on the dielectric layer 84, referred to as semiconductor on insulator (SOI). The SOI structure can be formed by a proper technology, such as separation by implanted oxygen (SIMOX) or wafer bonding to include the dielectric layer inside semiconductor material.

The semiconductor layer 86 is patterned to form fin active regions 88 and 90. The fin active regions 88 and 90 are configured and oriented in parallel. The fin active regions 88 & 90 and the STI features can be formed in a processing sequence including forming a patterned mask layer on the semiconductor layer and etching the semiconductor layer through the openings of the patterned mask layer. The patterned mask layer can be a patterned photoresist layer or a patterned hard mask layer, such as a patterned silicon nitride layer.

Various gates are further formed on the fin active regions. A gate feature includes a gate dielectric layer 92 (such as silicon oxide) and a gate electrode 94 (such as doped polysilicon) disposed on the gate dielectric layer 92. In one embodiment, the gate dielectric layer 92 includes high-k dielectric material layer. The gate electrode 94 includes metal, such as aluminum, copper, tungsten, or other proper conductive material. In the present embodiment for illustration, the semiconductor structure 80 includes a first region 96 for one or more FinFETs and a second region 98 for one or more FinFETs.

In one embodiment, the processing flow to form a SRAM cell, including the pass-gate and pull-down devices, have the following steps: formation of fin active regions; well formation; gate formation; epitaxy growth; light doped drain (LDD) formation; pocket implant (pocket junction) formation; gate spacer formation; source/drain (S/D) dopant formation; interlayer dielectric (ILD) formation; gate replacement; forming contact holes; silicide formation and forming contacts.

Figure 3:
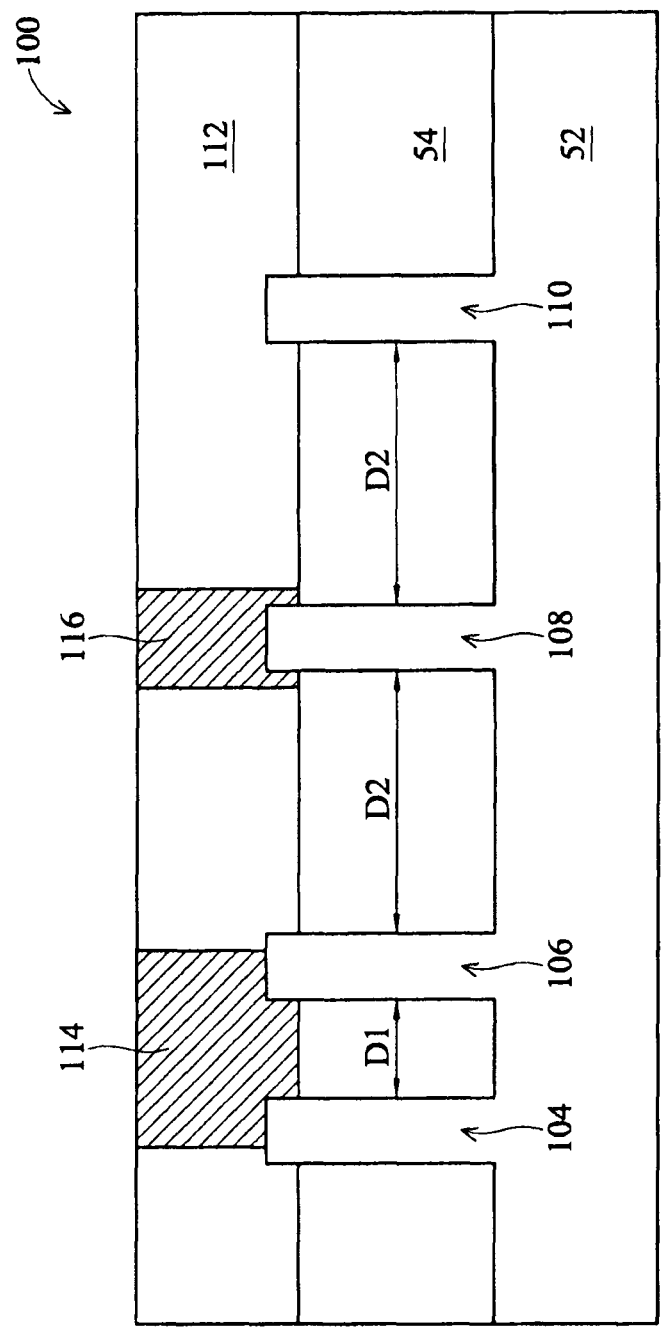

FIG. 3 is a sectional view of a semiconductor structure 100 having various FinFETs and contacts constructed according to various aspects of the present disclosure. The semiconductor structure 100 is a portion of a SRAM cell. The semiconductor structure 100 includes a semiconductor substrate 52 and isolation features 54 similar to the semiconductor substrate 52 and the isolation feature 54 of FIG. 1. The semiconductor structure 100 includes various fin active regions 104, 106, 108 and 110 similar to the fin active regions 56 and 58 of FIG. 1 in terms of composition and formation. The fin active regions 104, 106, 108 and 110 are configured with different spacing (or distance) between adjacent fin active regions. In the present embodiment, the fin active regions 104 and 106 are configured to have a first spacing "D1." The fin active region 108 is configured to have a second spacing "D2" from adjacent fin active regions 106 and 110. The second spacing D2 is greater than the first spacing D1. The first spacing D1 and the second spacing D2 are referred to as narrow spacing and wide spacing, respectively. The semiconductor structure 100 further includes an interlayer dielectric (ILD) 112 disposed on the fin active regions and the isolation features. The ILD 112 includes one or more dielectric materials for providing isolation to interconnections. In one embodiment, the ILD 112 includes silicon oxide formed by chemical vapor deposition (CVD). In another embodiment, the ILD 112 includes a dielectric material of a low dielectric constant, such as a dielectric constant less than about 3.5. In another embodiment, the ILD 112 includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD 112 may be formed by a technique including spin-on, CVD, sputtering, or other suitable processes.

The semiconductor structure 100 further includes various contact formed in the ILD 112 and configured to provide electrical routing. The contacts are vertical conductive features designed to electrically connect sources, drains and gate electrodes to metal lines. The contacts are a portion of the multilayer interconnect for wiring. In the present embodiment, the various contacts and other interconnect features are configured to form a SRAM cell. The first contact 114 is designed with a proper geometry and is disposed to electrically contact both fin active regions 104 and 106. In one embodiment, the contact 114 is configured to electrically contact both sources of a first FinFET on the fin active region 104 and a second FinFET on the fin active region 106. In furtherance of the present embodiment, the first and second FinFETs are both pull-down devices configured in parallel: the sources are connected to the power line Vss and the drains are connected together (further coupled to the drain of an associated pull-up device as one inverter of the SRAM cell). Since the sources of the both FinFETs are designed to be applicable of a same electrical voltage (and the drains of the both FinFETs are designed to couple together), the fin active regions 104 and 106 are designed with a smaller spacing D1 to reduce the cell size. The semiconductor structure 100 also includes a second contact 116 designed and configured to land on and electrically connect only the fin active region 108. In one embodiment, the second contact 116 is configured to electrically contact source of a third FinFET on the fin active region 108. In order to avoid any electrical malfunctions caused by misalignment, the adjacent fin active regions 106 and 110 are designed to have a larger spacing D2 with enough margin according to the manufacturing capability. Due to the manufacturing capability including lithography patterning, the reduction on the spacing between the adjacent fin active regions is limited by the manufacturing capability.

The formation of various contacts (such as contacts 114 and 116) includes forming contact holes in the ILD 112 and filling the contact hole with a conductive material. The contact holes can be formed by a lithography process and an etch process, such as plasma dry etch. In the lithography process, a patterned photoresist layer is formed on the ILD 112 with various openings defining regions for the contact holes. The etch process is applied to the ILD 112 to form the contact holes using the patterned photoresist layer as an etch mask layer. Alternatively, a hard mask is formed using the patterned photoresist layer and the etch process is applied to the ILD 112 through the openings of the patterned hard mask layer. The filling in the contact holes includes a deposition process to form one or more conductive materials in the contact holes. The deposition process may include CVD, sputtering, plating, or combinations thereof. A chemical mechanical polishing (CMP) process may be subsequently applied to remove the excessive conductive materials and planarize the surface. In one embodiment, the formation of the various contacts includes forming a patterned photoresist layer by a lithography process; etching the ILD 112 to form contact holes; forming a conductive material in the contact holes; and performing a CMP to the ILD.

The contacts and other interconnect features include vias and metal lines to form an interconnect to electrically configure the FinFETs to functional circuits, such as a SARM cell or SRAM array. In one embodiment, tungsten is used to form tungsten plug in the contact holes. In another embodiment, the conductive material filled in the contact holes includes tungsten, aluminum, copper, other proper metals, or combinations thereof. In yet another embodiment, the contacts further include a barrier layer formed on the sidewalls of the contact holes before filling the contact holes with conductive material. For example, a titanium nitride may be deposited on the sidewalls of the contact holes by sputtering.

In another embodiment, a silicide feature is formed between the contact and fin active region to reduce the contact resistance. Specifically, a silicide material is formed on the bottom of the contact holes and is disposed directly on the fin active regions within the contact holes. In one example, the silicide feature is formed by a process known in the art as self-aligned silicide (salicide). In one embodiment of salicide technique, a metal layer is first deposited on the semiconductor structure 100. The metal layer directly contacts silicon of the fin active regions within the contact holes. Then an annealing process with a proper temperature is applied to the semiconductor structure 100 such that the metal layer and the silicon of the fin active regions react to form silicide. The unreacted metal after the annealing process can be removed from the contact holes. The metal material used to form silicide includes titanium, nickel, cobalt, platinum, palladium tungsten, tantalum or erbium in various embodiment. In yet another embodiment, the method of forming contacts includes forming a patterned photoresist layer by a lithography process; etching the ILD 112 to form contact holes; forming silicide on fin active regions within the contact holes; forming a conductive material in the contact holes; and performing a CMP process to the ILD. In yet another embodiment, the silicide includes titanium (Ti), cobalt (Co), nickel (Ni), molybdenum (Mo), platinum (Pt), or combinations thereof.

Other processing steps may be implemented before, during and/or after the formation of the contacts. For example, the multilayer interconnection is further formed after the formation of the various contacts. The multilayer interconnection includes vertical interconnects, such as conventional vias in addition to the contacts and horizontal interconnect including metal lines. The various interconnection features may implement various conductive materials including copper, aluminum, tungsten and silicide. In one example, a damascene process is used to form copper related multilayer interconnection structure.

In the semiconductor structure 100, a SRAM cell includes multiple fin active regions with varying spacing or pitch. The pitch of multiple fin active regions is defined as a dimension from one fin active region to an adjacent fin active region. Furthermore, the semiconductor structure 100 includes two types of contacts, the first type of contacts is designed to electrically contact two adjacent fin active regions having a smaller spacing, such as the first spacing D1. The second type of contacts is designed to electrically contact only one fin active region having a larger spacing (such as D2) from the adjacent fin active regions. By implementing the above multiple fin active regions with varying spacing and two types of contacts configured with the fin active regions according to the respective spacing, the SRAM cell is further reduced in the cell area and improved on the cell quality such that the various issues discussed in the background are addressed.

Figure 4:
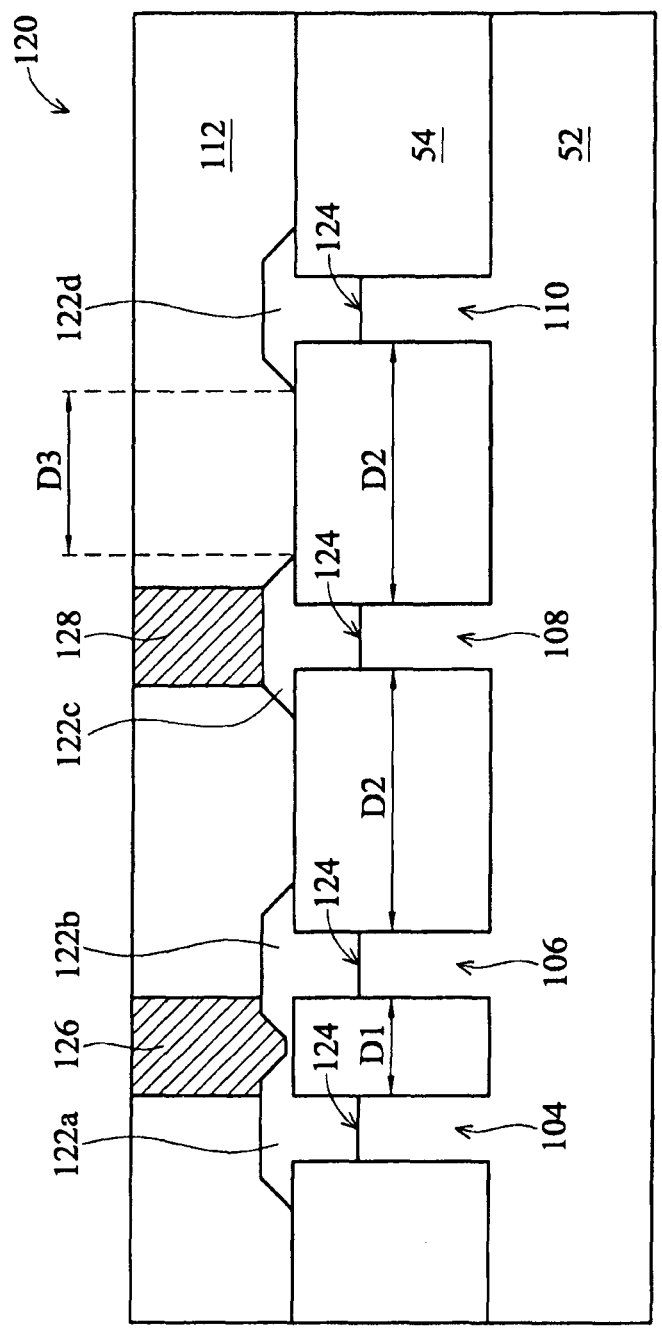

FIG. 4 is a sectional view of a semiconductor structure 120 having various FinFETs and contacts constructed according to various aspects of the present disclosure in another embodiment. The semiconductor structure 120 is a portion of a SRAM cell. The semiconductor structure 120 includes a semiconductor substrate 52 and isolation features 54 similar to the those of the semiconductor structure 100 in FIG. 3. The semiconductor structure 120 includes various fin active regions 104, 106, 108 and 110. The fin active regions 104, 106, 108 and 110 include a first portion extended from the semiconductor substrate 52 and a second portion formed on the first portion as epitaxy features 122. In the present embodiment, the epitaxy features 122 include 122a, 122b, 122c and 122d formed on the fin active regions 104, 106, 108 and 110, respectively. An interface 124 is formed between the epitaxy features 122 and first portion of the fin active regions. In one embodiment, the first portion of the fin active regions and the epitaxy features include a same semiconductor material, such as silicon. In another embodiment, the first portion of the fin active region include silicon and the epitaxy features include different semiconductor material(s) for strained effect. In furtherance of the embodiment, the epitaxy features 122 in a n-well include silicon germanium (SiGe) configured for p-type FinFETs. The epitaxy features 122 in a p-well include silicon carbide (SiC) or silicon configured for n-type FinFETs. The epitaxy features 122 are formed by one or more epitaxy steps. In one embodiment, the isolation features 54 are formed by the STI technique; then the first portion of the fin active region extended from the semiconductor substrate 52 is recessed by an etching process; and then an epitaxy process is performed to form the second portion of the fin active regions. In the case the epitaxy features 122 (as the second portion of the fin active regions) use various semiconductor materials (such as silicon germanium for p-type FinFETs and silicon carbide for n-type FinFETs), two epitaxy processes are implemented to respective fin active regions. In the present embodiment, the epitaxy process is implemented after the formation polysilicon gate stacks.

The fin active regions 104, 106, 108 and 110 are configured with different spacing between adjacent fin active regions. In the present embodiment, the fin active regions 104 and 106 are configured to have a first spacing D1. The fin active region 108 is configured to have a second spacing D2 from adjacent fin active regions 106 and 110. The second spacing D2 is greater than the first spacing D1.

When the epitaxy features 122 are formed on the respective fin active regions, lateral epitaxy growth will enlarge the dimension of the fin active regions and narrow the spacing as illustrated in FIG. 4. For the fin active regions with the second spacing D2 to the adjacent fin active regions, the respective epitaxy features have a spacing D3 less than D2. For example, the fin active regions 108 and 110 have the spacing D3 between the respective epitaxy features 122c and 122d. For the fin active regions with the first spacing D2, the respective epitaxy features have a narrow spacing or are even laterally merged (bridged) together. For example, the epitaxy features 122a and 122b are merged together to form a continuous landing feature. Since the epitaxy features are formed after the formation of the polysilicon gate stacks, the epitaxy features will only be formed on the source and drain regions but not on a portion of the fin active regions wherein the polysilicon gate stacks run over.

The semiconductor structure 120 includes an interlayer dielectric (ILD) 112 disposed on the fin active regions and the isolation features. The ILD 112 is similar to that of the semiconductor structure 100 in FIG. 3 in terms of composition and formation.

The semiconductor structure 120 further includes various contacts formed in the ILD 112 and configured to provide electrical routing. The present embodiment includes contacts 126 and 128. The contact 126 is designed with a proper geometry and is disposed to electrically contact both epitaxy features 122a and 122b. Alternatively, the contact 126 is configured to land on the merged epitaxy features 122a and 122b. In this case, the contact 126 may have a less dimension than the contact 114 of FIG. 3. The contact 128 is designed to land only on the epitaxy feature 122c that has a larger spacing D3 from the adjacent epitaxy features (122b and 122d). Similar to the contacts 114 and 116 of FIG. 3, contacts 126 and 128 are designed to reduce the SRAM cell size without sacrificing the quality of the SRAM device.

The formation of various contacts (such as contacts 126 and 128) is similar to the formation of the contacts 114 and 116 of FIG. 3 and includes forming contact holes in the ILD 112 and filling the contact hole with a conductive material. In another embodiment, the formation of the contacts 126 and 128 includes forming contact holes in the ILD 112, forming silicide on the substrate within the contact holes and filling the contact hole with a conductive material.

FIGS. 1 to 4 provide various portions of a SRAM cell and various embodiments of a same portion of the SRAM cell. For example, FIGS. 1 and 2 provide sectional views of the SRAM cell along a gate stack in two different embodiment. FIGS. 3 and 4 provide sectional views of the SRAM cell along a source/drain region in two different embodiment.

FIGS. 5 to 15 provide other embodiments of a SRAM cell according to various aspects of the present disclosure.

Figure 5:
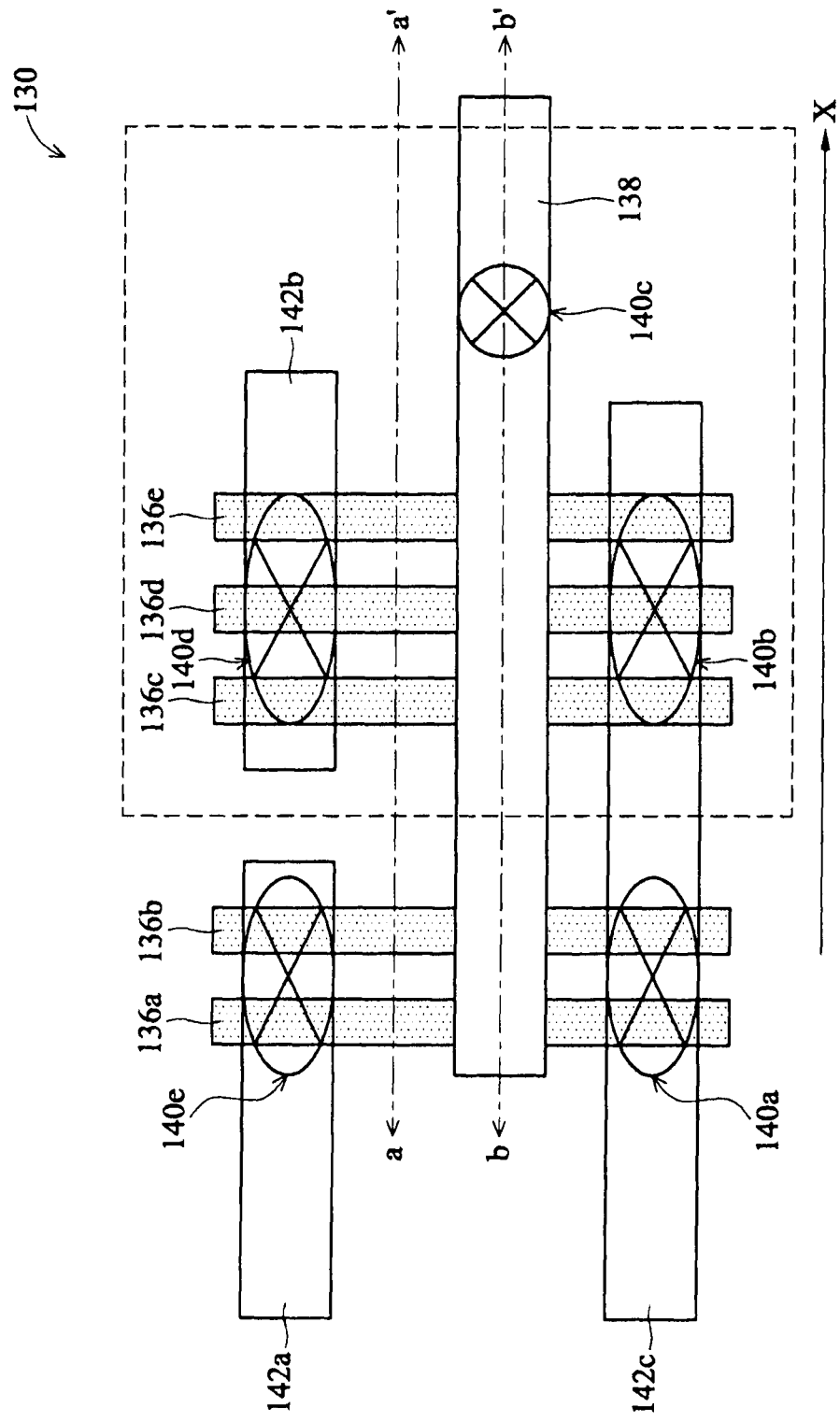
FIGS. 5 to 7 are top views of a SRAM device or a portion thereof constructed according to various aspects of the present disclosure in various embodiments.

FIG. 5 is a top view of a semiconductor structure 130 as a portion of a SRAM cell. In the present embodiment, the semiconductor structure 130 includes a n-well region 132 and a p-well region 134. The semiconductor structure 130 includes multiple fin active regions 136a through 136e. For example, the fin active regions 136a and 136b are disposed in the p-well region 134 for forming various n-type FinFETs (such as pull-down devices and/or pass-gate devices), and the fin active regions 136c, 136d and 136e are disposed in the n-well region 132 for forming various p-type FinFETs (such as pull-up devices). A gate 138 is formed over the multiple fin active regions 136a through 136e. Various contacts 140a through 140e are formed on some fin active regions and the gate 138. For example, the contact 140a is formed on drains of the n-type FinFETs associated the fin active regions 136a and 136b. The contact 140e is formed on sources of the n-type FinFETs associated the fin active regions 136a and 136b. The contact 140e is coupled to the complimentary power line Vss. In another example, the contact 140b is formed on drains of the p-type FinFETs associated the fin active regions 136c, 136d and 136e. The contact 140d is formed on sources of the p-type FinFETs associated the fin active regions 136c, 136d and 136e. The contact 140d is coupled to the power line Vcc. The contact 140c is formed on the gate 138. The semiconductor structure 130 also includes metal lines 142a, 142b and 142c. For example, the metal line 142a is coupled to the contact 140e and the complimentary power line Vss. The metal line 142b is coupled to the contact 140d and the power line Vcc. The metal line 142c is coupled to the contact 140a and 140a.

Figure 8:
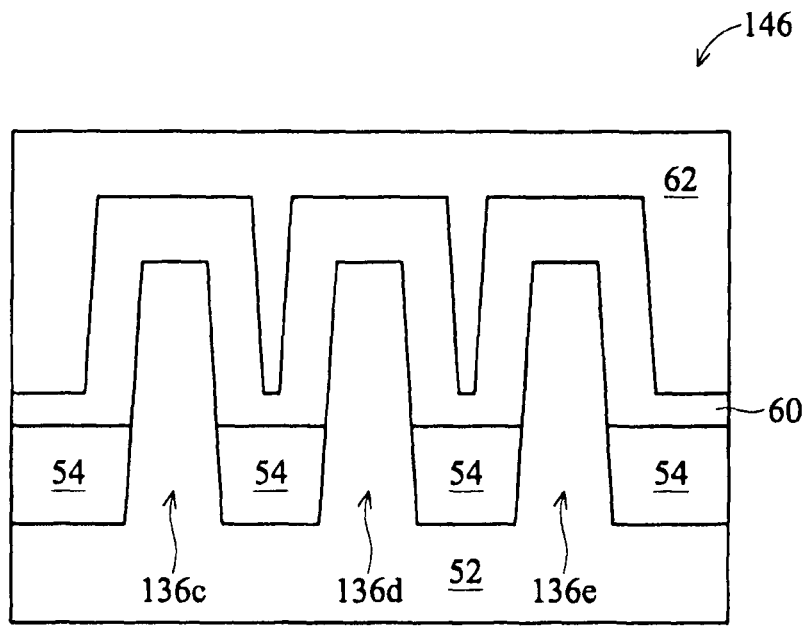
FIGS. 8 to 15 are sectional views of a portion of a SRAM device constructed according to various aspects of the present disclosure in various embodiments.
Figure 9:
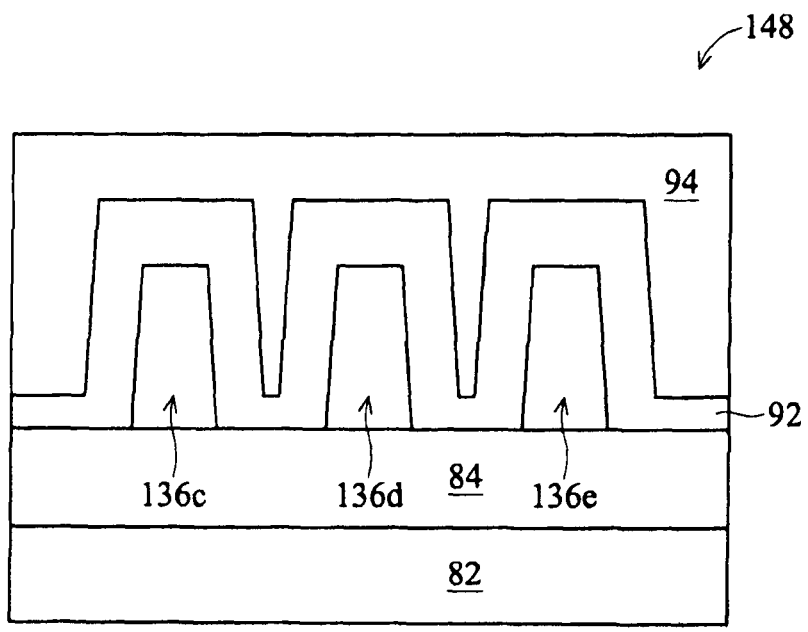

A sectional view of the semiconductor structure 130 along the line aa' is shown, in portion, in FIGS. 8 and 9 for different embodiments. In FIG. 8, a semiconductor structure 146 includes a semiconductor structure 52; isolation features 54; the fin active regions 136c, 136d and 136e; gate dielectric 60 and the gate electrode 62. Various features in the semiconductor structure 146 are similar to the corresponding features in the semiconductor structure 50 of FIG. 1. In another embodiment shown in FIG. 9, a semiconductor structure 148 includes a semiconductor structure 82; a dielectric material layer 84; the fin active regions 136c, 136d and 136e; gate dielectric 92 and the gate electrode 94. Various features in the semiconductor structure 148 are similar to the corresponding features in the semiconductor structure 80 of FIG. 2.

Figure 10:
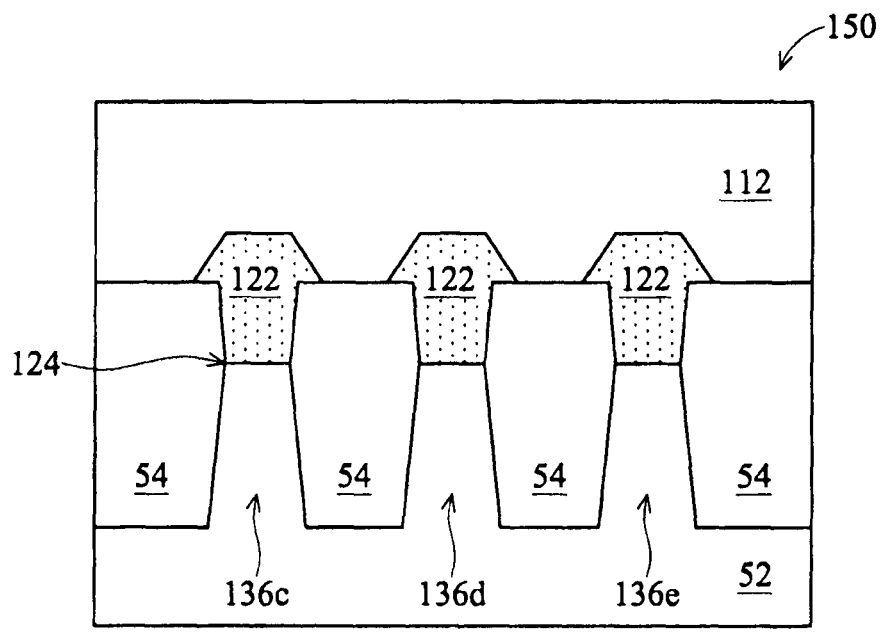

Referring back to FIG. 5, a sectional view of the semiconductor structure 130 along the line bb' is shown (in portion) in FIGS. 10 through 15 in various embodiments. In FIG. 10, a semiconductor structure 150 illustrates a right portion of the semiconductor structure 130 along the line bb'. The semiconductor structure 150 includes the semiconductor structure 52; the isolation features 54; the fin active regions 136c, 136d and 136e; epitaxy features 122; and interlayer dielectric (ILD) 112. An interface 124 is formed between the epitaxy features 122 and the fin active regions. Various features in the semiconductor structure 150 are similar to the corresponding features in the semiconductor structure 120 of FIG. 4. For example, the fin active regions 136c, 136d and 136e have a large spacing D2 and the epitaxy features 122 have a spacing D3 less than D2. In various embodiments, the epitaxy features may include silicon germanium for p-type FinFETs or silicon carbide for n-type FinFETs.

Figure 11:
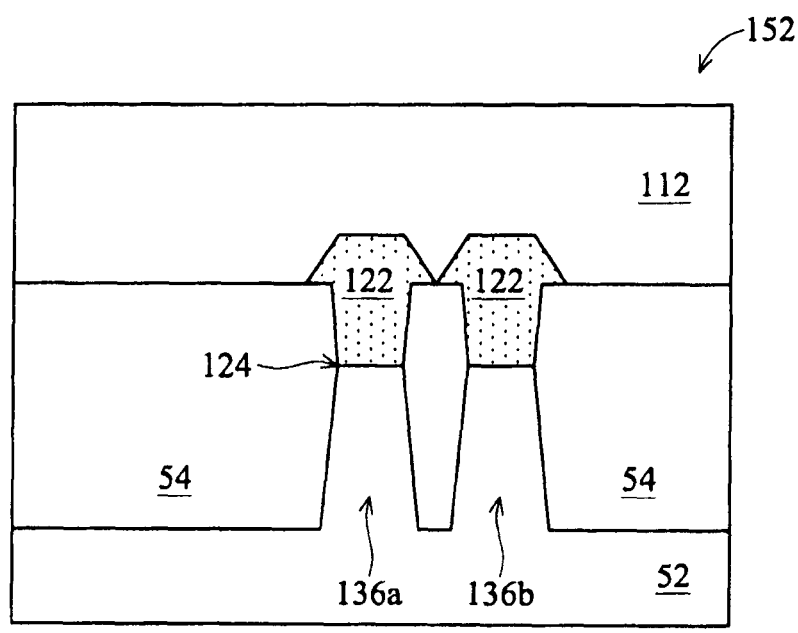

In another embodiment illustrated in FIG. 11, a semiconductor structure 152 includes the semiconductor structure 52; the isolation features 54; the fin active regions 136a and 136b; epitaxy features 122; and the ILD 112. In one embodiment, the semiconductor structure 152 illustrates a left portion of the semiconductor structure 130 in FIG. 5. Various features in the semiconductor structure 150 are similar to the corresponding features in the semiconductor structure 120 of FIG. 4. For example, the fin active regions 136a and 136b are similar to the fin active regions 104 and 106 of FIG. 4. The fin active regions 136a and 136b have a smaller spacing D1. The epitaxy features 122 are similar to the epitaxy features 122a and 122b of FIG. 4. The two adjacent epitaxy features 122 are merged together. In various embodiments, the epitaxy features may include silicon germanium for p-type FinFETs or silicon carbide for n-type FinFETs.

Figure 12:
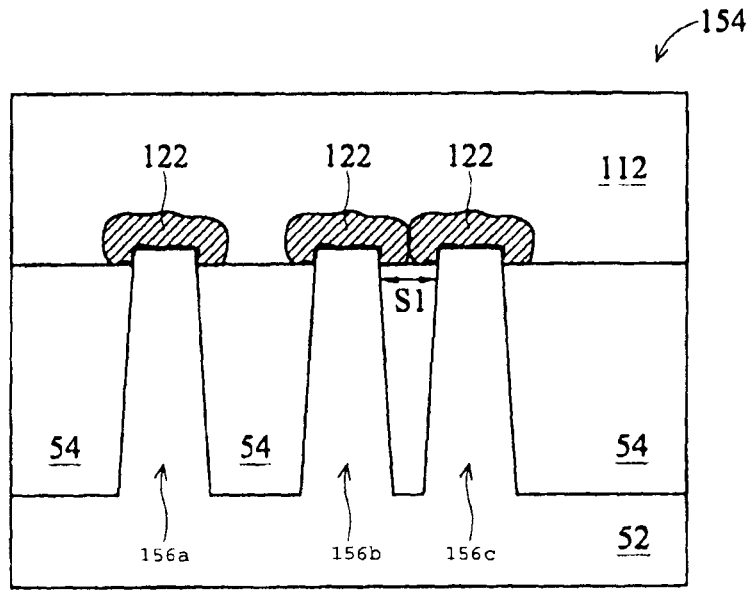

In another embodiment illustrated in FIG. 12, a semiconductor structure 154 includes the semiconductor structure 52; the isolation features 54; the fin active regions 156a, 156b and 156c; epitaxy features 122; and the ILD 112. Various features in the semiconductor structure 154 are similar to the corresponding features in the semiconductor structure 120 of FIG. 4. For example, the fin active regions 156b and 156c are similar to the fin active regions 104 and 106 of FIG. 4. The fin active region 156a is similar to the fin active region 108 of FIG. 4. The fin active regions 156b and 156c have a smaller spacing S1. The epitaxy features 122 associated with the adjacent fin active regions 156b and 156c are merged together. The epitaxy feature 122 on the fin active region 156a laterally expands but is separated from the adjacent epitaxy feature 122 with a distance. In one embodiment, the silicon substrate 52 include silicon and the epitaxy features 122 include silicon as well.

Figure 13:
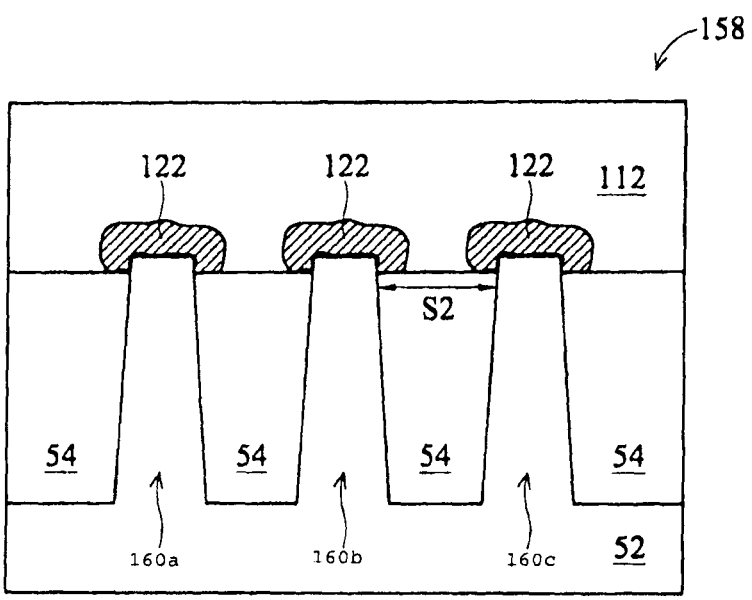

In another embodiment illustrated in FIG. 13, a semiconductor structure 158 includes the semiconductor structure 52; the isolation features 54; the fin active regions 160a, 160b and 160c; epitaxy features 122; and the ILD 112. Various features in the semiconductor structure 158 are similar to the corresponding features in the semiconductor structure 120 of FIG. 4. For example, the fin active regions 160a, 160b and 160c are similar to the fin active regions 108 and 110 of FIG. 4. The fin active regions 160a, 160b and 160c have a larger spacing S2. The epitaxy features 122 laterally expand but are separated from the adjacent epitaxy feature 122. In one embodiment, the silicon substrate 52 include silicon and the epitaxy features 122 include silicon as well.

Figure 14:
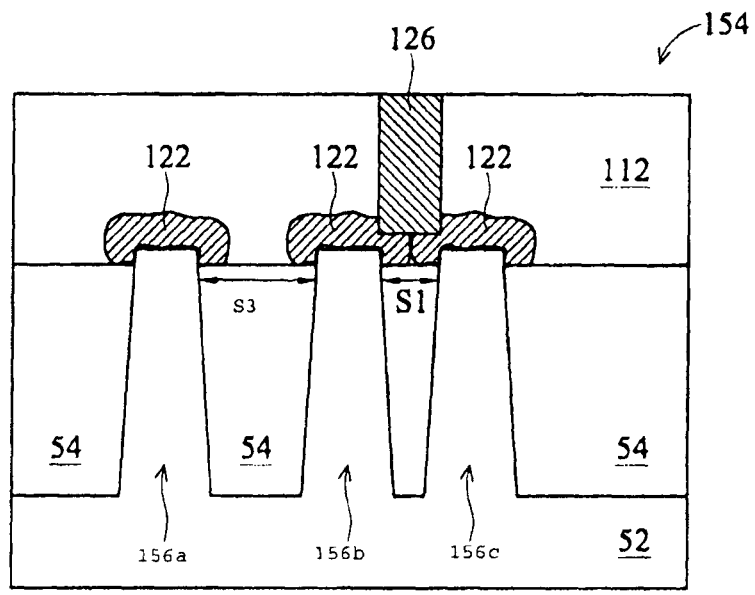

FIG. 14 is a sectional view of the semiconductor structure 154, similar to the FIG. 12 but further including a contact 126. The contact 126 is disposed on the merged epitaxy features 122 and electrically connected to the two corresponding fin active regions 156a and 156b. The contact 126 is similar to the contact 126 of FIG. 4

Figure 15:
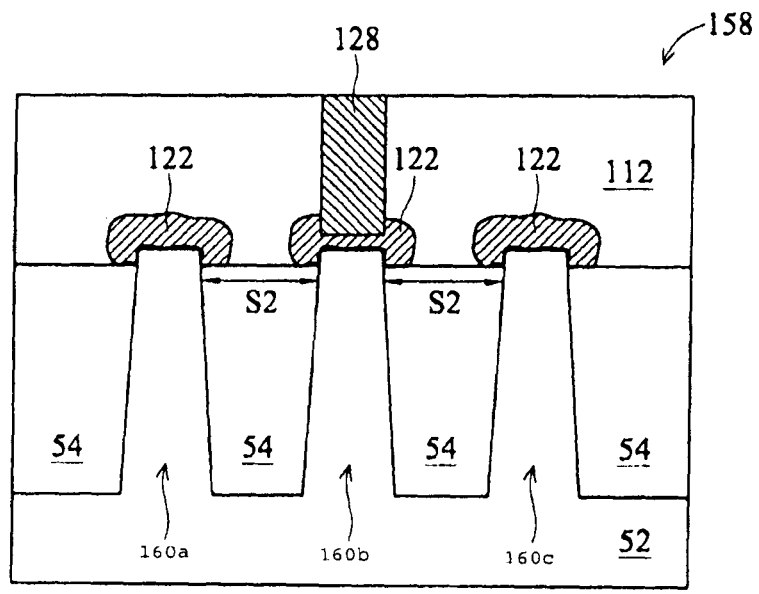

FIG. 15 is a sectional view of the semiconductor structure 158, similar to the FIG. 13 but further including a contact feature 128. The contact feature 128 lands on the epitaxy feature 122 of the fin active regions 160b. The contact 128 is similar to the contact 128 of FIG. 4.

Figure 6:
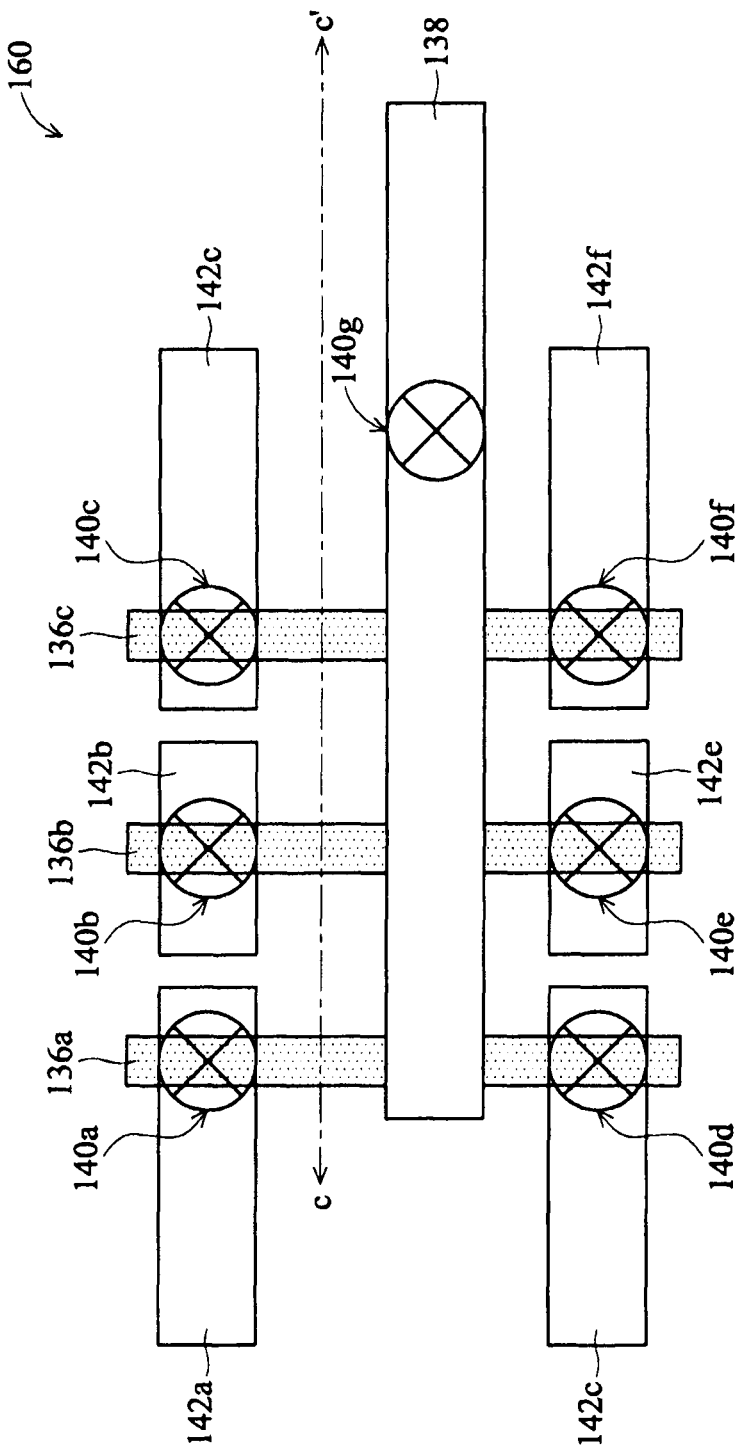

FIG. 6 is a top view of a semiconductor structure 160 as a portion of a SRAM cell. In the present embodiment, the semiconductor structure 160 includes multiple fin active regions 136a through 136c. In various embodiments, the fin active regions 136a, 136b and 136c are disposed in different well regions for different FinFETs. For example, the fin active regions 136a and 136b are disposed in a p-well region for forming various n-type FinFETs (such as pull-down devices and/or pass-gate devices), and the fin active region 136c is disposed in a n-well region for forming various p-type FinFETs (such as pull-up devices). A gate 138 is formed over the multiple fin active regions 136a through 136c. Various contacts 140a through 140g are formed on some fin active regions and the gate 138. Various metal lines 142a through 142f are formed over the contacts and designed to couple with the respective contacts to form a functional circuit. In the present embodiment, the functional circuit includes one or more SRAM cells. In various examples, the contact 140a is designed to land on the fin active region 136a and is coupled to the metal line 142a. The contact 140b is designed to land on the fin active region 136b and is coupled to the metal line 142b, and so on. The contact 140g is designed to land on the gate 138.

Furthermore, the contact 140a contacts a source region of a first FinFET and the contact 140d contacts a drain region of the first FinFET. The contact 140b contacts a source region of a second FinFET and the contact 140e contacts a drain region of the second FinFET. The contact 140c contacts a source region of a third FinFET and the contact 140f contacts a drain region of the third FinFET. The contacts 140a through 140f are similar to the contact 128 of FIG. 4. A sectional view of the semiconductor structure 160 along the line cc' is shown, in portion, in FIG. 10, which is described previously.

Figure 7:
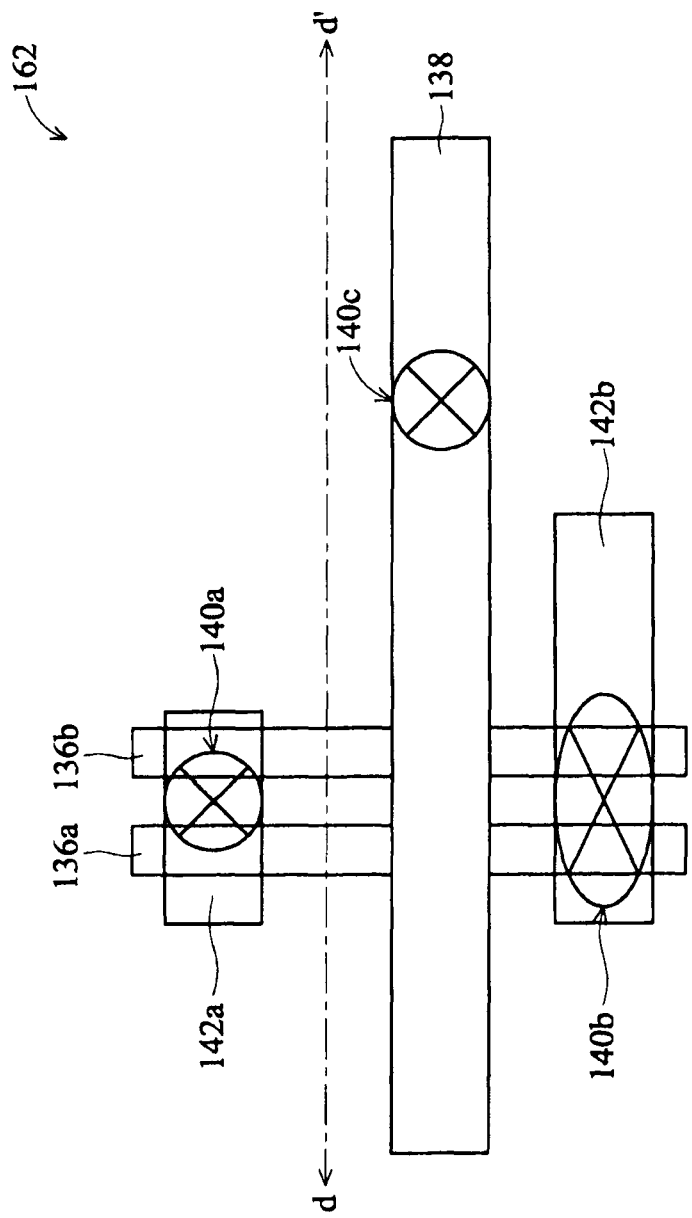

FIG. 7 is a top view of a semiconductor structure 162 as a portion of a SRAM cell. In the present embodiment, the semiconductor structure 162 includes multiple fin active regions 136a and 136b. In one embodiment, the fin active regions 136a and 136b are disposed in a well region (a n-well or a p-well). For example, the fin active regions 136a and 136b are disposed in a p-well region for forming various n-type FinFETs (such as pull-down devices and/or pass-gate devices). A gate 138 is formed over the multiple fin active regions 136a and 136b to form the first and second FinFETs. Various contacts 140a through 140c are formed on the fin active regions and the gate 138. Various metal lines 142a and 142b are formed over the contacts and designed to couple with the respective contacts to form a functional circuit. In one example, the contact 140a is disposed between the two adjacent fin active regions 136a and 136b. The contact 140a contacts both the adjacent fin active regions 136a and 136b. Similarly, the contact 140b is disposed between the two adjacent fin active regions 136a and 136b, and contacts both the adjacent fin active regions 136a and 136b. The contact 140a is further coupled to the metal line 142a. The contact 140b is further coupled to the metal line 142b. Furthermore, the contact 140a contacts source regions of the first and second FinFETs and the contact 140b contacts drain regions of the first and second FinFETs. A sectional view of the semiconductor structure 162 along the line dd' is shown, in portion, in FIG. 11, which is described previously.

In one embodiment, the processing flow to form a SRAM cell, including the pass-gate, pull-down and pull-up devices, have the following steps: formation of fin active regions, well formation, channel dopant formation, gate formation, epitaxy growth to form epitaxy features, light doped drain (LDD) formation, gate spacer formation, source/drain (S/D) dopant formation, ILD deposition, gate replacement to form gate stacks having high-k dielectric material and metal gate electrode, etching to form contact holes, formation of silicide on source/drain regions and gates, forming contacts, and subsequent steps to form multilayer metal lines and vias. Particularly, the epitaxy features are formed after the gate formation and are only formed on the source and drain regions. The fin active regions include portions underlying the gate stacks are free of the epitaxy semiconductor materials and are not enlarged laterally. The fin active regions are configured with different spacing. A SRAM cell includes two adjacent fin active regions having a small spacing D1 and a fin active region having a larger spacing D2 from the adjacent active regions. The two fin active regions with the smaller spacing D1 include a further reduced spacing between the corresponding epitaxy features. In one case, the two epitaxy features are merged together. The SRAM cell also includes a first and second type of contacts. The first type of contacts each is formed between the two fin active regions with the smaller spacing D1 and contacts the both two fin active regions. The second type of contacts each is disposed on a fin active region having the larger spacing D2 from the adjacent fin active regions and contacts only the corresponding fin active region.

Figure 16:
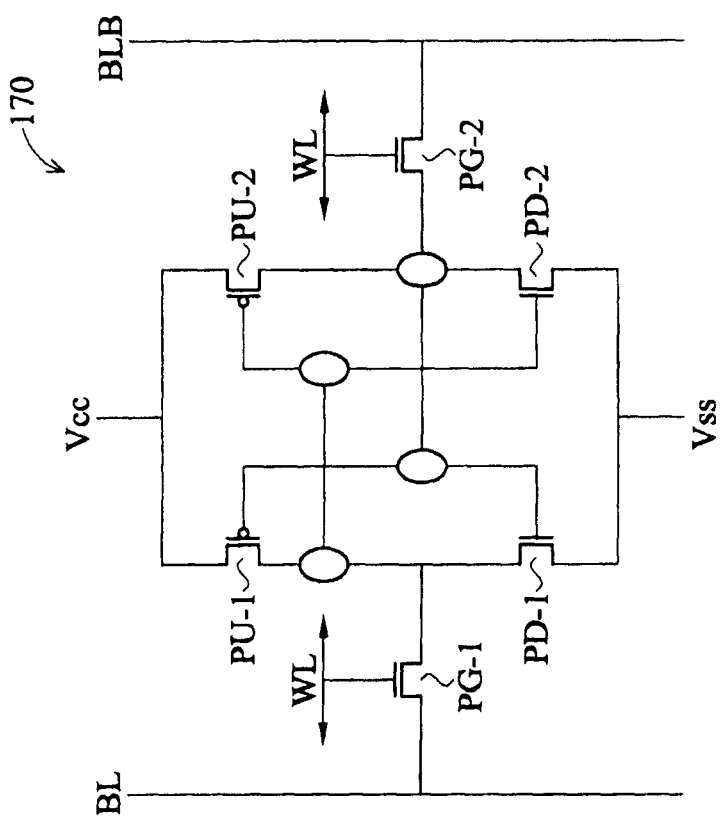
FIG. 16 is a schematic view of a static random access memory (SRAM) device constructed according to various aspects of the present disclosure in one embodiment.

FIG. 16 is a schematic view of a SRAM cell 170 constructed according to various aspects of the present disclosure in one embodiment. The SRAM cell 170 includes fin field-effect transistors (FinFETs). The SRAM cell 170 includes a first and second inverters that are cross-coupled as a data storage. The first inverter includes a first pull-up device formed with a p-type fin field-effect transistor (pFinFET), referred to as PU-1. The first inverter includes a first pull-down device formed with an n-type fin field-effect transistor (nFinFET), referred to as PD-1. The drains of the PU-1 and PD-1 are electrically connected together, forming a first data node ("Node 1"). The gates of PU-1 and PD-1 are electrically connected together. The source of PU-1 is electrically connected to a power line Vcc. The source of PD-1 is electrically connected to a complimentary power line Vss. The second inverter includes a second pull-up device formed with a pFinFET, referred to as PU-2. The second inverter also includes a second pull-down device formed with an nFinFET, referred to as PD-2. The drains of the PU-2 and PD-2 are electrically connected together, forming a second data node ("Node-2). The gates of PU-2 and PD-2 are electrically connected together. The source of PU-2 is electrically connected to the power line Vcc. The source of PD-2 is electrically connected to the complimentary power line Vss. Furthermore, the first data node is electrically connected to the gates of PU-2 and PD-2, and the second data node is electrically connected to the gates of PU-1 and PD-1. Therefore, the first and second inverters are cross-coupled as illustrated in FIG. 16.

The SRAM cell 170 further includes a first pass-gate device formed with an n-type fin field-effect transistor (nFinFET), referred to as PG-1, and a second pass-gate device formed with an n-type fin field-effect transistor (nFinFET), referred to as PG-2. The source of the first pass-gate PG-1 is electrically connected to the first data node and the source of the first pass-gate PG-2 is electrically connected to the second data node, forming a port for data access. Furthermore, the drain of PG-1 is electrically connected to a bit line ("BL"), and the gate of PG-1 is electrically connected to a word line ("WL"). Similarly, the drain of PG-2 is electrically connected to a bit line bar ("BLB"), and the gate of PG-2 is electrically connected to the word line WL.

In one embodiment, the various nFinFETs and pFinFETs are formed using high-k/metal gate technology so the gate stacks includes a high-k dielectric material layer for gate dielectric and one or more metals for gate electrode. The SRAM cell 170 may include additional devices, such as additional pull-down devices and pass-gate devices. In one example, each of the first and second inverters includes multiple pull-down devices formed on multiple fin active regions and configured in parallel. The multiple pull-down devices in parallel are configured such that the drains are connected together, the sources are connected together to the complimentary power line Vss, the gates are connected together. In this case, the fin active regions with the smaller spacing D1 are implemented and the first type of contacts are formed on the closed disposed or merged epitaxy features.

In yet another example, the cell 170 include an additional port having two or more pass-gate devices for additional data access, such as data reading or writing. Those pass-gate devices are configured in parallel and can also implement the configuration and design of the fin active regions and the first type of contacts similar to those for the pull-down devices in parallel. In another example, if a pull-up device may implement the fin active region having the larger spacing D2 from the adjacent fin active regions and the second type of contacts. In another embodiments, a contact is designed to land on and contact multiple fin active regions tightly packed (e.g., with the smaller spacing D1). For example with reference to FIG. 5, the contact 140d contacts three fin active regions 136c, 136d and 136e.

In various embodiments, the disclosed SRAM device addresses various issues noted in the background. In one example, by implementing first fin active regions with the smaller spacing D1 and a second fin active regions with the larger spacing D2, the first type of contacts to the first fin active regions, and the second type of contacts to the second fin active regions, the SRAM cell area is reduced while the functionality and performance of the SRAM cell are improved or maintained. In another embodiment, an epitaxy feature includes a raised structure having a top surface higher than the gate dielectric layer of the corresponding gate stack. In a particular example, the epitaxy feature with the raised structure is a silicon epitaxy feature. In yet another embodiment, the two merged epitaxy features are two silicon epitaxy features. A silicide is formed on the two merged silicon epitaxy features so that the corresponding sources or drains are electrically connected together.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
    a first fin active region, a second fin active region, and a third fin active region extending from a semiconductor substrate, wherein the first and second fin active regions are spaced apart from each other a first distance and the second and third fin active regions are spaced apart from each other a second distance, wherein the second distance is different than the first distance;
    a plurality of fin field-effect transistors (FinFETs) formed on at least one of the first, second, and third fin active regions;
    a first contact disposed on the first and second fin active regions; and
    a second contact disposed on the third fin active region.

2. The device of claim 1, further comprising a fourth fin active region extending from the semiconductor substrate, the third and fourth fin active regions are spaced way from each other the second distance.

3. The device of claim 1, wherein the second distance is greater than the first distance.

4. The device of claim 1, wherein at least one of the first and second fin active regions includes an epitaxy feature formed thereon.

5. The device of claim 4, wherein the epitaxy feature includes at least one of silicon germanium and silicon carbide.

6. The device of claim 1, wherein the first contact physically contacts the first and second fin active regions.

7. The device of claim 1, wherein the plurality of FinFETs include:
    a first inverter including a first pull-up transistor (PU-1) and a first and second pull-down transistors (PD-1 and PD-2); and
    a second inverter including a second pull-up transistor (PU-2) and a third and fourth pull-down transistors (PD-3 and PD-4), the second inverter being cross-coupled with the first inverter for data storage, and
    wherein the PD-1 and PD-2 are formed on the first and second fin active regions, respectively.

8. A device comprising:
    a first fin active region, a second fin active region, and a third fin active region extending from a semiconductor substrate;
    a first isolation element extending a first distance from the first fin active region to the second fin active region;
    a second isolation element extending a second distance from the second fin active region to the third fin active region, wherein the second distance is different than the first distance;
    a plurality of fin field-effect transistors (FinFETs) formed on at least one of the first, second, and third fin active regions;
    a first contact disposed on the first and second fin active regions; and
    a second contact disposed on the third fin active region.

9. The device of claim 8, wherein the first and second fin active regions have a first silicon epitaxy feature and a second silicon epitaxy feature, respectively.

10. The device of claim 9, further comprising a silicide feature formed on the first and second silicon epitaxy features.

11. The device of claim 8, further comprising a fourth fin active region extending from the semiconductor substrate; and
    a third isolation element extending the second distance from the third fin active region to the fourth fin active region.

12. The device of claim 11, wherein the second contact is not electrically coupled to the fourth fin active region.

13. The device of claim 8, wherein the plurality of FinFETs includes:
    a first pull-up device and a second pull-up device;
    a first pull-down device configured with the first pull-up device to form a first inverter;
    a second pull-down device configured with the second pull-up device to form a second inverter; and
    a first and second pass-gate devices configured with the first and second inverters as a first port.

* * * * *